(12) United States Patent
Shim

(10) Patent No.: US 7,375,019 B2
(45) Date of Patent: May 20, 2008

(54) IMAGE SENSOR AND METHOD FOR FABRICATING THE SAME

(75) Inventor: Hee Sung Shim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 344 days.

(21) Appl. No.: 11/022,645

(22) Filed: Dec. 28, 2004

(65) Prior Publication Data

US 2005/0205955 A1 Sep. 22, 2005

(30) Foreign Application Priority Data

Dec. 31, 2003 (KR) ............... 10-2003-0101698

(51) Int. Cl.
*H01L 21/44* (2006.01)

(52) U.S. Cl. ............... 438/607; 438/533; 438/534; 438/576; 257/E21.538

(58) Field of Classification Search ............ 438/533, 438/534, 576, 607; 257/E21.538
See application file for complete search history.

(56) References Cited

U.S. PATENT DOCUMENTS

| | | | | |
|---|---|---|---|---|
| 3,709,746 A | * | 1/1973 | De Witt ............... | 438/349 |
| 4,038,680 A | * | 7/1977 | Yagi et al. ............... | 257/555 |
| 4,755,478 A | * | 7/1988 | Abernathey et al. ........ | 438/296 |
| 4,983,536 A | * | 1/1991 | Bulat et al. ............... | 438/192 |
| 5,073,810 A | * | 12/1991 | Owada et al. ............... | 257/588 |
| 5,589,847 A | * | 12/1996 | Lewis ............... | 345/98 |
| 5,659,194 A | * | 8/1997 | Iwamatsu et al. ............ | 257/377 |
| 5,693,555 A | * | 12/1997 | Kim et al. ............... | 438/207 |
| 6,040,592 A | * | 3/2000 | McDaniel et al. .......... | 257/292 |
| 6,333,229 B1 | * | 12/2001 | Furukawa et al. .......... | 438/270 |
| 6,756,264 B2 | * | 6/2004 | Cho et al. ............... | 438/241 |
| 7,030,551 B2 | * | 4/2006 | Yamazaki et al. .......... | 313/498 |
| 7,241,705 B2 | * | 7/2007 | Basceri et al. ............... | 438/783 |
| 2001/0030574 A1 | * | 10/2001 | Takai ............... | 327/563 |
| 2002/0050604 A1 | * | 5/2002 | Kikkawa ............... | 257/192 |
| 2003/0068871 A1 | * | 4/2003 | Chan et al. ............... | 438/486 |
| 2004/0072399 A1 | * | 4/2004 | Cha ............... | 438/202 |
| 2005/0280004 A1 | * | 12/2005 | Das et al. ............... | 257/77 |

* cited by examiner

*Primary Examiner*—Michelle Estrada
*Assistant Examiner*—Jarrett J Stark
(74) *Attorney, Agent, or Firm*—Finnegan, Henderson, Farabow, Garrett & Dunner, L.L.P.

(57) ABSTRACT

An image sensor and a method for fabricating the same are disclosed, to improve a contact quality between a contact plug and a source diffusion layer. The image sensor includes a photodiode in an active area of a semiconductor substrate, for receiving incident external light and generating optical charges; a transistor having an impurity diffusion layer electrically connected with the photodiode, for transferring/discharging the optical charges generated by the photodiode to a signal processing circuit; an impurity implantation layer having impurity selectively implanted thereto, for selectively covering the impurity diffusion layer; an insulating interlayer above the semiconductor substrate to cover the photodiode, the transistor, and the impurity implantation layer; an open hole penetrating the insulating interlayer, for selectively opening the impurity diffusion layer; and a contact plug for filling the open hole, and electrically connecting the impurity diffusion layer and a metal line provided above the insulating interlayer.

2 Claims, 7 Drawing Sheets

IMAGE SENSOR AND METHOD FOR FABRICATING THE SAME

This application claims the benefit of the Korean Application No. P2003-101698 filed on Dec. 31, 2003, which is hereby incorporated by reference.

BACKGROUND OF THE INVENTION

1. Field of the Invention

The present invention relates to an image sensor, and more particularly, to an image sensor and a method for fabricating the same, to improve a contact quality between a contact plug and a source diffusion layer by forming an impurity implantation layer, having an impurity selectively implanted thereto, on the source diffusion layer, thereby realizing an optimal image quality in the completed image sensor.

2. Discussion of the Related Art

In recent, as a rapid development of electrical and electronic technologies, various electronic equipments using an image sensor technology, for example, a video camera, a digital camera, a personal computer having a small-sized camera, a mobile phone having a small-sized camera, etc. have been widely studied and researched, and used.

Conventionally, the image sensor is used of a charge coupled device (hereinafter, referred to as a "CCD"). However, the CCD has the disadvantageous characteristics of requirements for a high driving voltage and an additional supporting circuit, and of a high fabrication cost, whereby the CCD is a decreasing trend in use.

Recently, a complementary metal oxide semiconductor (hereinafter, referred to as a "CMOS") image sensor has great attentions as a substitute for the CCD. The CMOS image sensor is fabricated in a CMOS circuit technology. That is, unlike the related art CCD, the CMOS image sensor has the advantageous characteristics such as a low driving voltage, no requirement for an additional supporting circuit, and a low fabrication cost.

As shown in FIG. 1, the related art CMOS image sensor is formed on an active area of a semiconductor substrate 1 defined by a device isolation layer 3, wherein the CMOS image sensor is comprised of a photodiode 2 for receiving the light from the external and generating optical charges, and a transistor 10 for transferring/discharging the optical charges generated by the photodiode 2 to a signal processing circuit.

In this case, for example, the photodiode 2 is comprised of an N-type impurity diffusion layer 2a and a P-type impurity diffusion layer 2b. The transistor 10 is comprised of a gate insulating layer pattern 11, a gate electrode pattern 12, a spacer 13, source/diffusion layers 16/15, and a salicide layer 17.

At this time, a metal line 25 is formed above the semiconductor substrate 1, to transfer an external electric signal to the transfer 10. Also, an insulating interlayer 26 is formed between the metal line 25 and the semiconductor substrate 1, wherein the insulating interlayer 26 insulates the metal line 25 from the semiconductor substrate 1. In this case, the metal line 25 forms an electric signal connection with the transistor 10 by a contact plug 24 of filling an open hole H.

At this time, for example, the insulating interlayer 26 is comprised of a boron-phosphorous silicate glass layer (hereinafter, referred to as a "BPSG layer") 22 and an Ozone Tetra Ethyl Ortho Silicate layer (hereinafter, referred to as a "TEOS layer") 23. In this case, a barrier layer 21 is additionally formed in the interface between the semiconductor substrate 1 and the insulating interlayer 26, to protect the semiconductor substrate 1 from the process stress for formation of the insulating interlayer 26, and to enhance a contact quality between the semiconductor substrate 1 and the insulating interlayer 26.

In the CMOS image sensor according to the related art, the source diffusion layer 16 of the transistor 10, being electrically connected with the photodiode 2, functions as a main node of transferring the optical charges generated in the photodiode 2 to the external, for example, an outlead circuit. Accordingly, the process for enhancing the electric contact quality between the contact plug 24 and the source diffusion layer 16 is very important for improvement of image quality in the CMOS image sensor.

However, the related art CMOS image sensor has difficulties in improving the electric contact quality between the contact plug 24 and the source diffusion layer 16.

For example, since the open hole H functions as a main channel of the contact plug 24, the open hole is formed in a large size, to increase a contact area between the contact plug 24 and the source diffusion layer 16, thereby improving the contact quality between the contact plug 24 and the source diffusion layer 16. Under the substantial fabrication process, it is very difficult to maintain a constant thickness of the insulating interlayer 26, and to form the uniform open hole H in the insulating interlayer 26 from an upper side to a lower side. As a result, it has the limitation to the increase of the contact area between the contact plug 24 and the source diffusion layer 16, thereby causing the deterioration of the contact quality between the contact plug 24 and the source diffusion layer 16.

Also, in case of the related art CMOS image sensor, it is possible to increase the impurity concentration of the source diffusion layer 16 by increasing the amount of impurity implanted to the source diffusion layer 16, thereby inducing the improvement of the contact quality between the contact plug 24 and the source diffusion layer 16. In this case, since an impact is undesirably applied to the surface of the semiconductor substrate 1 by highly implanting the impurity, so that the completed source diffusion layer 16 undesirably has a current leakage. Thus, it has the limitation to the increase in amount of impurity implanted to the source diffusion layer 16, thereby causing the deterioration of the electric contact quality between the contact plug 24 and the source diffusion layer 16.

Like the aforementioned gate electrode pattern 12 and the drain diffusion layer 15, the salicide layer 17 may be additionally formed on the surface of the source diffusion layer 16, to realize the contact quality between the contact plug 24 and the source diffusion layer 16. In this case, as an undesirable impact is applied to the photodiode 2 of the semiconductor substrate 1 due to the formation of the salicide layer 17, whereby the performance of the completed photodiode 2 is largely lowered. In this respect, it is impossible to improve the contact quality between the contact plug 24 and the source diffusion layer 16 only by forming the salicide layer on the source diffusion layer 16 without the additional process.

SUMMARY OF THE INVENTION

Accordingly, the present invention is directed to an image sensor and a method for fabricating the same that substantially obviates one or more problems due to limitations and disadvantages of the related art.

An object of the present invention is to provide an image sensor and a method for fabricating the same, in which an impurity implantation layer of a constant thickness, having an impurity selectively implanted thereto, is additionally formed on a source diffusion layer, to control a substantial contact point between a contact plug and the source diffusion layer upward from a surface of a semiconductor substrate, so that it is possible to realize an open hole of a sufficient size by minimizing a length of the open hole which is a main channel of the contact plug, thereby improving a contact quality between the contact plug and the source diffusion layer.

Another object of the present invention is to provide an image sensor and a method for fabricating the same, to realize a high-impurity concentration in a source diffusion layer without troubles generated by high impurity implantation of the source diffusion layer and by formation of a salicide layer, thereby improving a contact quality between a contact plug and the source diffusion layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an image sensor includes a photodiode formed in an active area of a semiconductor substrate, for receiving incident light from the external and generating optical charges; a transistor having an impurity diffusion layer being electrically connected with the photodiode, for transferring/discharging the optical charges generated by the photodiode to a signal processing circuit; an impurity implantation layer having impurity selectively implanted thereto, for selectively covering the impurity diffusion layer; an insulating interlayer formed above the semiconductor substrate to cover the photodiode, the transistor, and the impurity implantation layer; an open hole penetrating the insulating interlayer, for selectively opening the impurity diffusion layer; and a contact plug for filling the open hole, and electrically connecting the impurity diffusion layer and a metal line provided above the insulating interlayer.

In another aspect, a method for fabricating an image sensor includes steps of forming a photodiode and a transistor having an impurity diffusion layer being electrically connected with the photodiode, in an active area of a semiconductor substrate; selectively forming an impurity implantation layer on the impurity diffusion layer; selectively implanting impurity to the impurity implantation layer; forming an insulating interlayer above the semiconductor substrate, the insulating interlayer for covering the photodiode, the transistor, and the impurity implantation layer; selectively opening the insulating interlayer to expose the impurity implantation layer; and forming a contact plug for electrically connecting the impurity implantation layer of the opened area with a metal layer provided above the insulating interlayer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an image sensor and a method for fabricating the same according to the present invention will be described with reference to the accompanying drawings.

Figure 1:
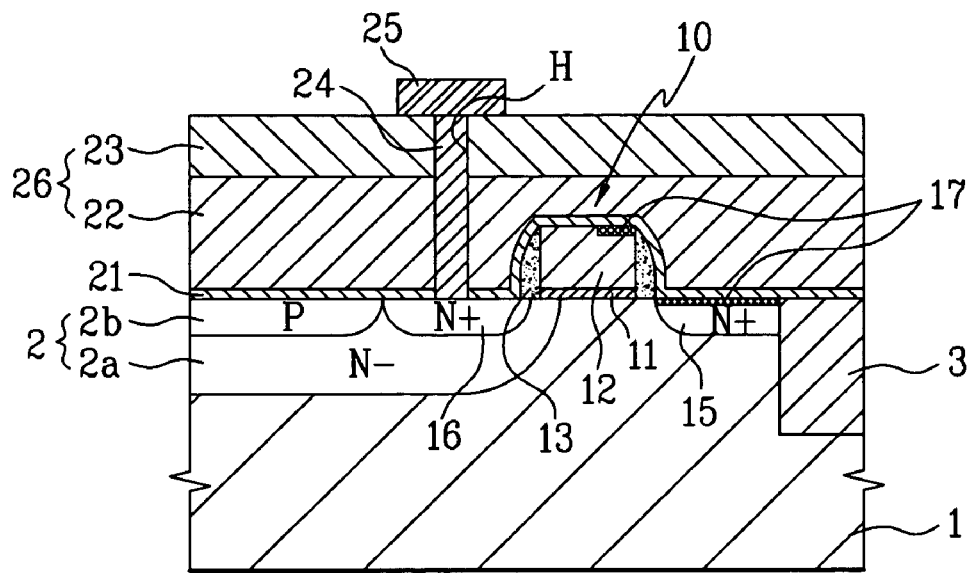
FIG. 1 is an exemplary view of an image sensor according to the related art.
Figure 2:
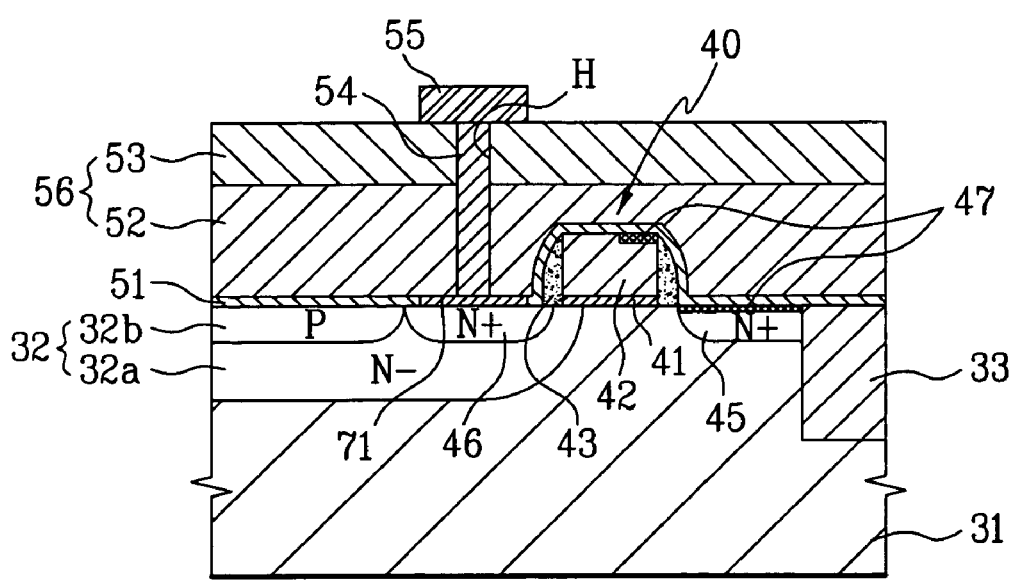
FIG. 2 is an exemplary view of an image sensor according to the present invention.

As shown in FIG. 2, a CMOS image sensor according to the present invention is formed in an active area of a semiconductor substrate 31 defined by a device isolation layer 33, wherein the CMOS image sensor is comprised of a photodiode 32 for receiving the incident light from the external and generating optical charges, and a transistor 40 for transferring/discharging the optical charges generated in the photodiode 32 to a signal processing circuit.

For example, the photodiode 32 is comprised of a P-type impurity diffusion layer 32b and an N-type impurity diffusion layer 32a. Also, the transistor 40 is comprised of a gate insulating layer pattern 41, a gate electrode pattern 42, a spacer 43, an impurity diffusion layer such as source/drain diffusion layers 46/45, and a salicide layer 47.

In this case, the source diffusion layer 46 makes a junction with the P-type impurity diffusion layer 32b and the N-type impurity diffusion layer 32a of the photodiode 32, whereby the source diffusion layer 46 is electrically connected with the corresponding photodiode 32.

At this time, a metal line 55 is formed above the semiconductor substrate 31 to transmit external electric signals to the transistor 40. Also, an insulating interlayer 56 is formed between the metal line 55 and the semiconductor substrate 31, to insulate the corresponding metal line 55 from the semiconductor substrate 31, wherein the insulating interlayer 56 is positioned in state of covering the photodiode 32 and the transistor 40.

In this case, the metal line 55 penetrating the insulating interlayer 56 forms the electric signal connection with some of the transistor 40, for example, the source diffusion layer 46 by a contact plug 54 of filling an open hole H, the open hole H of partially opening the source diffusion layer 46.

At this time, the insulating interlayer 56, for example, is comprised of a BPSG layer 52 and a TEOS layer 53. In this case, a barrier layer 51, for example, a SiN layer is additionally formed in the interface between the semiconductor substrate 31 and the insulating interlayer 56, to protect the semiconductor substrate 31 from the process stress for formation of the insulating interlayer 56, and to enhance a contact quality between the semiconductor substrate 31 and the insulating interlayer 56. The insulating interlayer 56 may have the various structures according to the circumstances.

In the CMOS image sensor according to the present invention, the source diffusion layer 46 of the transistor 40, being electrically connected with the photodiode 32, functions as a main node of transferring the optical charges generated in the photodiode 32 to the external, for example, an outlead circuit. Accordingly, the process for enhancing the electric contact quality between the contact plug 54 and the source diffusion layer 46 is very important for the improvement of image quality in the completed CMOS image sensor.

As shown in the drawings, an impurity is highly implanted onto the source diffusion layer 46. In this state, an impurity implantation layer 71, preferably, an epitaxial silicon layer is additionally formed to selectively cover the source diffusion layer 46. At this time, the impurity implantation layer 71 having a predetermined thickness is electrically connected with the source diffusion layer 46, so that it is possible to control an electric contact point between the source diffusion layer 46 and the contact plug 54 upward from an upper side of the semiconductor substrate 31.

Also, in state of highly implanting the impurity to the impurity implantation layer 71, the impurity implantation layer 71 is electrically connected with the source diffusion layer 46, whereby the impurity concentration of the impurity implantation layer 71 becomes high.

In the related art CMOS image sensor, as an open hole functions as a main channel of a contact plug, the open hole is formed in a sufficiently large size, to increase a contact area between the contact plug and a source diffusion layer, thereby improving the contact quality between the contact plug and the source diffusion layer. Under the substantial fabrication process, it is very difficult to maintain a constant thickness of an insulating interlayer, and to form the uniform open hole in the insulating interlayer from an upper side to a lower side. As a result, it has the limitation to the increase of the contact area between the contact plug and the source diffusion layer, thereby causing the deterioration of the contact quality between the contact plug and the source diffusion layer.

Also, in case of the related art, by increasing the amount of impurity implanted to the source diffusion layer, the impurity concentration of the source diffusion layer becomes high, thereby inducing the improvement of the contact quality between the contact plug and the source diffusion layer. In this case, since an impact is undesirably applied to a surface of a semiconductor substrate on implantation of the impurity, the completed source diffusion layer undesirably has a current leakage. Thus, it has the limitation to the increase in amount of impurity implanted to the source diffusion layer, thereby causing the deterioration of the electric contact quality between the contact plug and the source diffusion layer.

However, in the CMOS image sensor according to the present invention, the impurity implantation layer 71 having the constant thickness, to which the impurity is selectively implanted, is formed on the source diffusion layer 46, so that it is possible to control the electric contact point between the source diffusion layer 46 and the contact plug 54 upward from the surface of the semiconductor substrate 31. Thus, the penetration length of the insulating interlayer 56 of the open hole H, which is the main channel of the contact plug 54, is decreased to a minimum size, whereby the open hole H is formed in the sufficiently large size, even though the complex fabrication conditions, thereby improving the contact quality between the contact plug 54 and the source diffusion layer 46.

Also, in the CMOS image sensor according to the present invention, in state the impurity implantation layer 71 having the impurity selectively implanted is formed on the source diffusion layer 46, the impurity implantation layer 71 is electrically connected with the source diffusion layer 46. Accordingly, without the additional process such as highly-impurity implantation and formation of a salicide layer, it is possible for the source diffusion layer 46 to increase the impurity concentration of impurity therein. Eventually, in case of realizing the image sensor according to the present invention, it is possible to the greatest contact quality between the contact plug 54 and the source diffusion layer 46 without the current leakage generated by the highly-impurity implantation and the damage of the photodiode generated by the formation of the salicide layer.

In case of realizing the greatest contact quality between the contact plug 54 and the source diffusion layer 46 with the additional impurity implantation layer 71, the source diffusion layer 46 normally performs a function of converting the optical charges generated by the photodiode 32 to voltage constituents (elements). Accordingly, the completed image sensor according to the present invention realizes the great image quality.

A method for fabricating the image sensor according to the present invention will be described as follows.

Figure 3A:
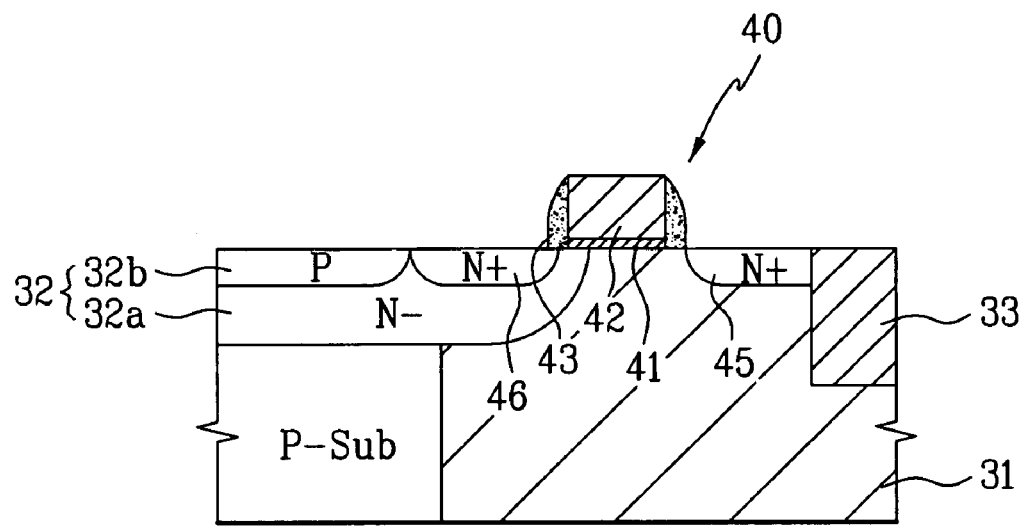
FIG. 3A to FIG. 3L are cross sectional views of the fabrication process for an image sensor according to the present invention.

First, as shown in FIG. 3A, the device isolation layer 33 is formed to define the active area of the semiconductor substrate 31 by selectively performing an STI (shallow trench isolation) process or an LOCOS (local oxidation of silicon) process. At this time, the semiconductor substrate 31 may be formed of a highly-doped P++ type monocrystalline silicon substrate. In this case, a p-type epitaxial layer (not shown) may be firstly preformed to increase a size (depth) of a depletion region.

Subsequently, a thermal oxidation process and a low-pressure CVD process are selectively performed in sequential, whereby a gate insulating layer is formed on an entire surface of the semiconductor substrate 31. After that, by additionally performing a low-pressure CVD process, a polysilicon layer is formed on the gate insulating layer. Then, the gate insulating layer and the polysilicon layer are patterned by photolithography, thereby forming the gate insulating layer pattern 41 and the gate electrode pattern 42 in the active area of the semiconductor substrate 31.

Next, as performing a low-pressure CVD process, an insulating layer for the spacer is formed on the entire surface of the semiconductor substrate 31 to cover the gate electrode pattern 42. Then, the spacer 32 is formed at a sidewall of the gate electrode pattern 42 by performing a dry-etch process, for example, RIE (reactive ion etch).

Then, ions are implanted in state of using the spacer 43 as a buffer mask, thereby forming the source/drain diffusion layers 46/45 at both sides of the gate electrode pattern 42. Accordingly, it is impossible to complete the transistor 40 for transfer/discharge the optical charges stored in the photodiode 32 to the external.

Although not shown, the transistors 40 of the same kind are formed on predetermined portions of the semiconductor substrate 31.

Subsequently, the photodiode 32 including the P-type impurity layer 32b and the N-type impurity layer 32a is formed at the side of the transistor 40 by the ion implantation process. In this case, the ion implantation sequence for formation of the photodiode 32 may be varied on the circumstances.

Although not shown, in the same way as the transistor 40, the photodiodes 32 of the same kind are formed on predetermined portions of the semiconductor substrate 31.

Figure 3B:
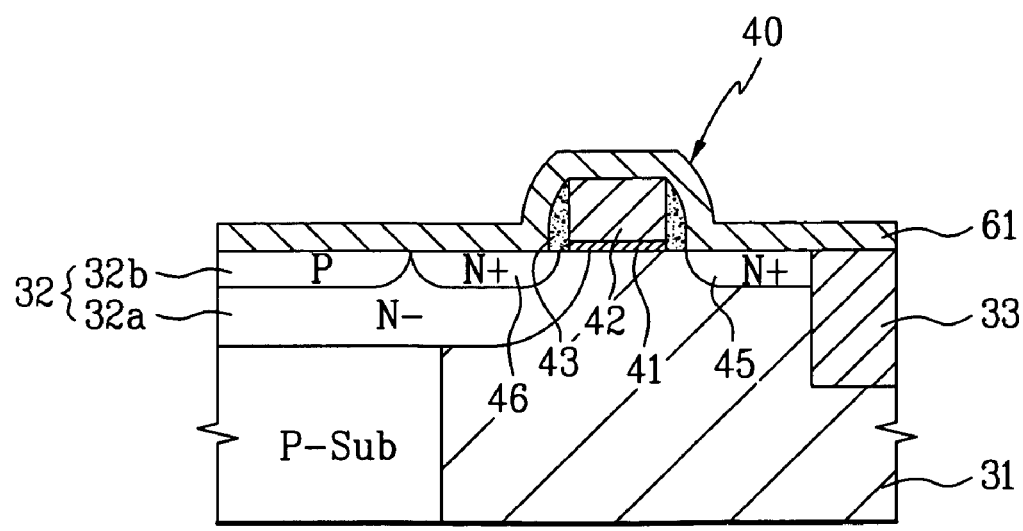
Figure 3C:
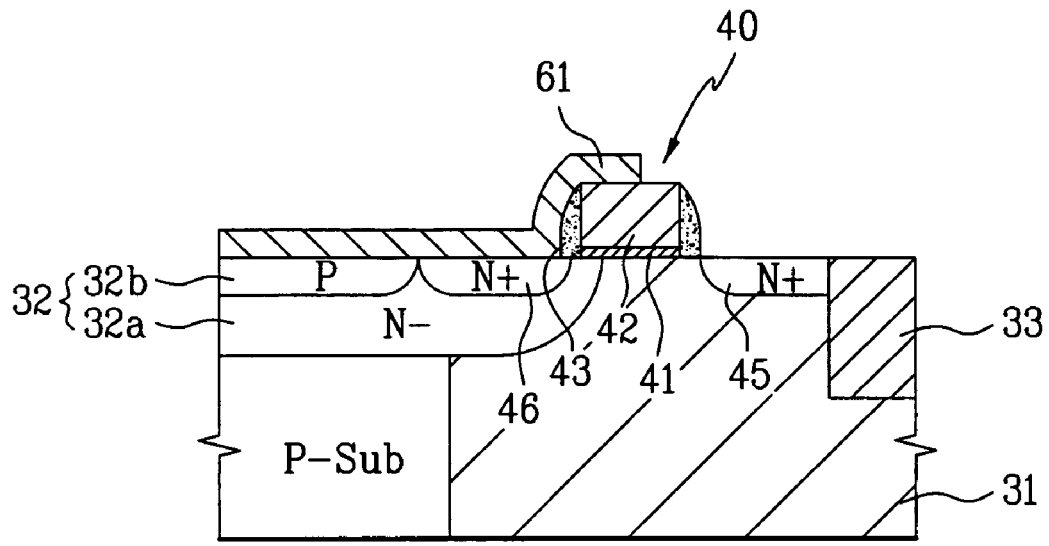

After completing the photodiode 32 and the transistor 40, a blocking layer 61 for formation of the salicide layer, for example, the TEOS layer is formed on the entire surface of the semiconductor substrate 31 including the photodiode 32 and the transistor 40, as shown in FIG. 3B, by performing a low-pressure CVD process. Then, the corresponding blocking layer 61 is patterned by photolithography, and some of the gate electrode pattern 42 and the drain diffusion layer 45 are exposed as shown in FIG. 3C.

Figure 3D:
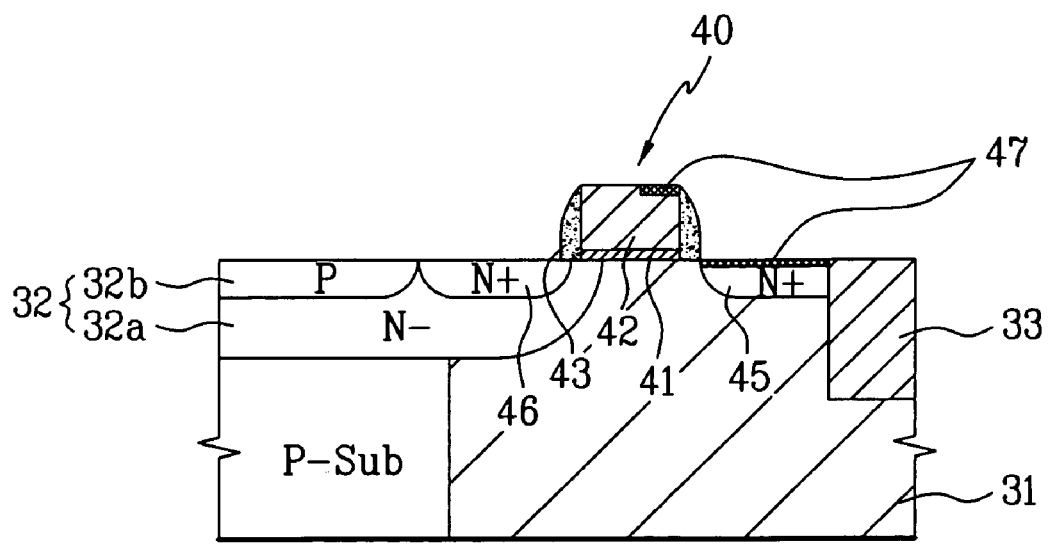

Also, a thin metal layer for formation of the salicide layer 17, for example, a Ti-layer is formed on the entire surface of the semiconductor substrate 31 including some of the gate electrode pattern 42 and the drain diffusion layer 45 by sputtering, and then a thermal process is performed to the semiconductor substrate 31 having the components. As a result, metal atoms of the thin metal layer react on silicon atoms, thereby forming the salicide layer 47 of $SiTi_x$ on the predetermined portion of the gate electrode pattern 42 and the drain diffusion layer 45, as shown in FIG. 3D. Then, the blocking layer 61 is removed from the semiconductor substrate 31.

Figure 3E:
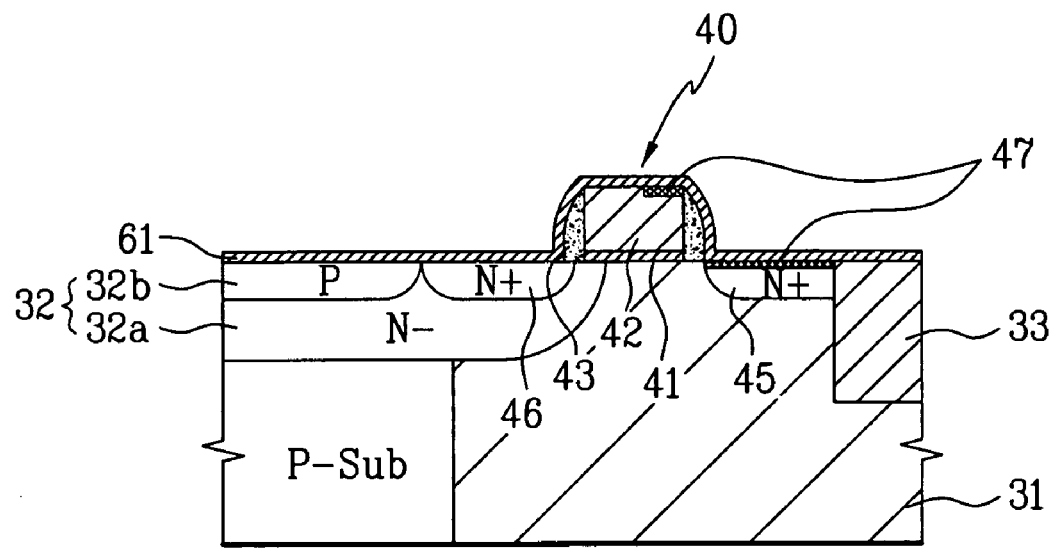

Thereafter, as shown in FIG. 3E, the barrier layer 51, for example, a SiN layer is formed on the entire surface of the semiconductor substrate 31 including the photodiode 32 and the transistor 40 by performing a CVD process. In this case, the barrier layer 51 is formed to protect the semiconductor substrate 31 from the fabrication stress for formation of the insulating interlayer 56, and to improve the contact quality between the semiconductor substrate 31 and the insulating interlayer 56.

Figure 3F:
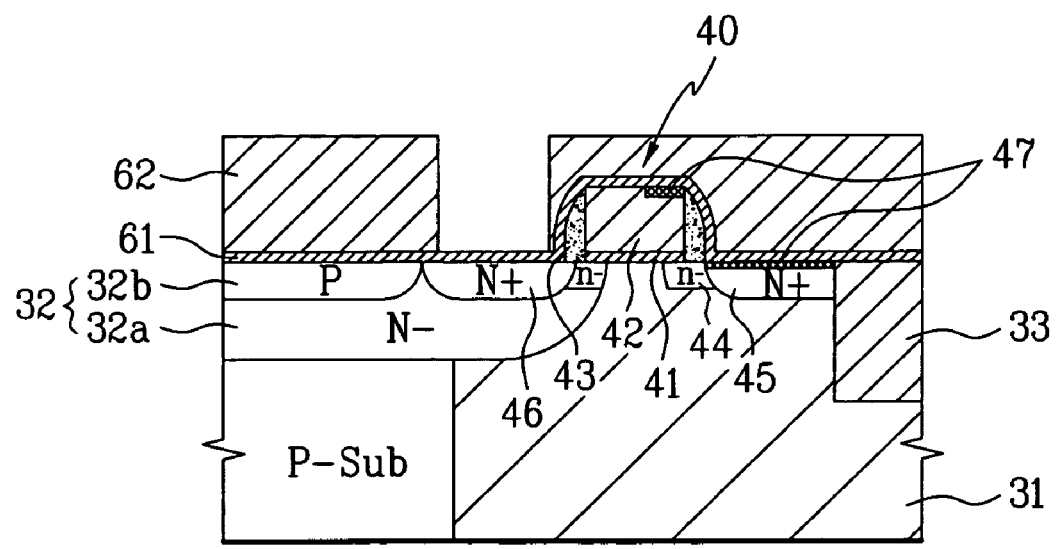

Subsequently, as shown in FIG. 3F, by performing a CVD process, a mask layer 62, for example, the TEOS layer is formed on the barrier layer 51. Then, the mask layer 62 is patterned by photolithography, thereby exposing the predetermined portion of the semiconductor substrate 31, for example, the barrier layer 51 provided above the source diffusion layer 46.

Figure 3G:
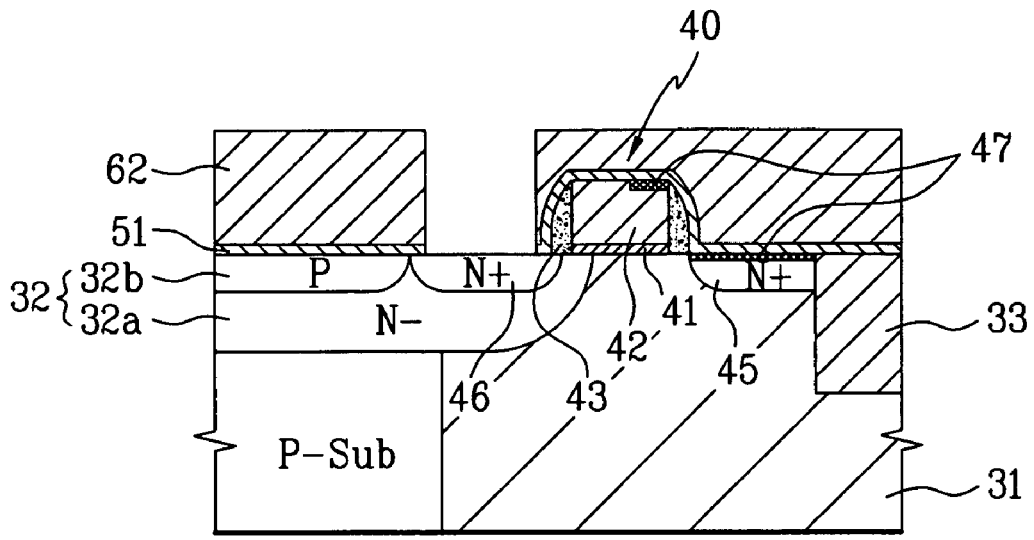
Figure 3H:
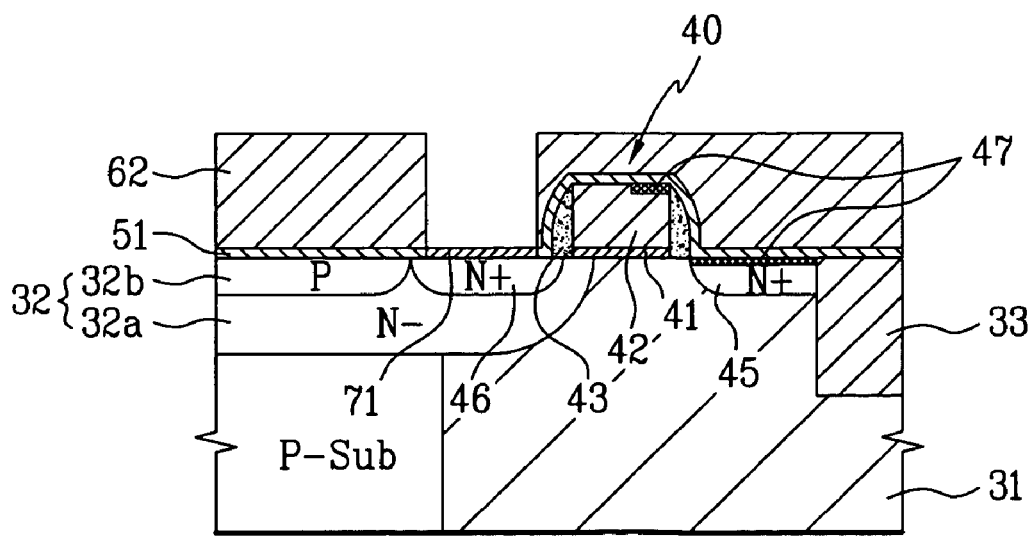

Next, as shown in FIG. 3G, the barrier layer exposed by the mask layer 62 is selectively removed by wet etching, and then the surface of the source diffusion layer 46 exposed by removing the barrier layer 51 grows epitaxially by an epitaxial growth process. Accordingly, as shown in FIG. 3H, it is possible to form the impurity implantation layer 71 having the constant thickness to cover the surface of the source diffusion layer 46.

As additionally forming the impurity implantation layer 71, it is possible to control the substantial contact point between the contact plug 54 and the source diffusion layer 46 upward from the surface of the semiconductor substrate 31. In this case, the mask layer 62 prevents the impurity implantation layer 71 from being unnecessarily formed on the semiconductor substrate except the open area.

Figure 3I:
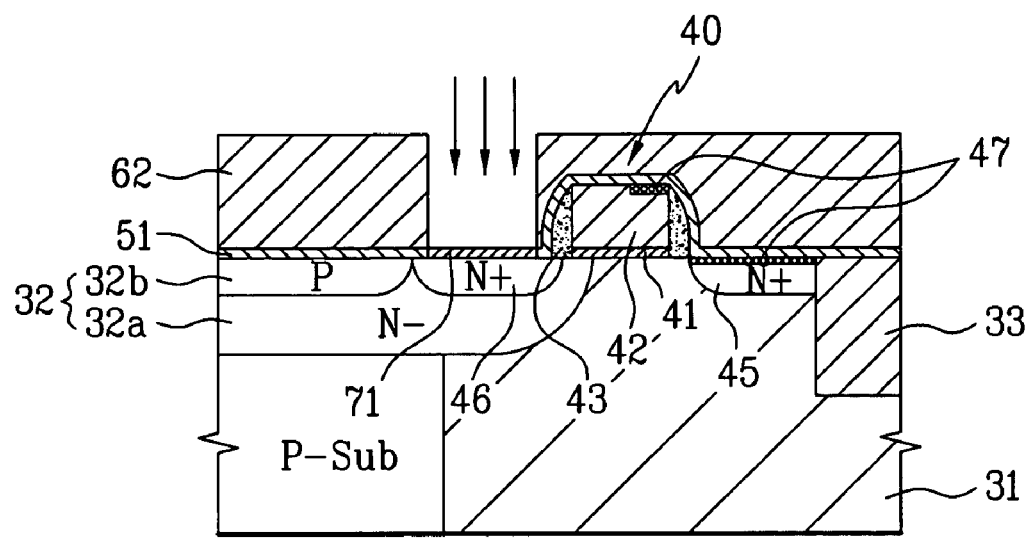

After completing the impurity implantation layer 71, as shown in FIG. 3I, the impurity is highly implanted in state of using the mask layer 62 as a buffer, whereby the impurity is selectively implanted to the impurity implantation layer 71.

According to the impurity implantation process, under the connection with the impurity implantation layer 71, the source diffusion layer 46 has the increase on concentration of the impurity thereof. After that, the mask layer 62 is removed from the semiconductor substrate 31.

Figure 3J:
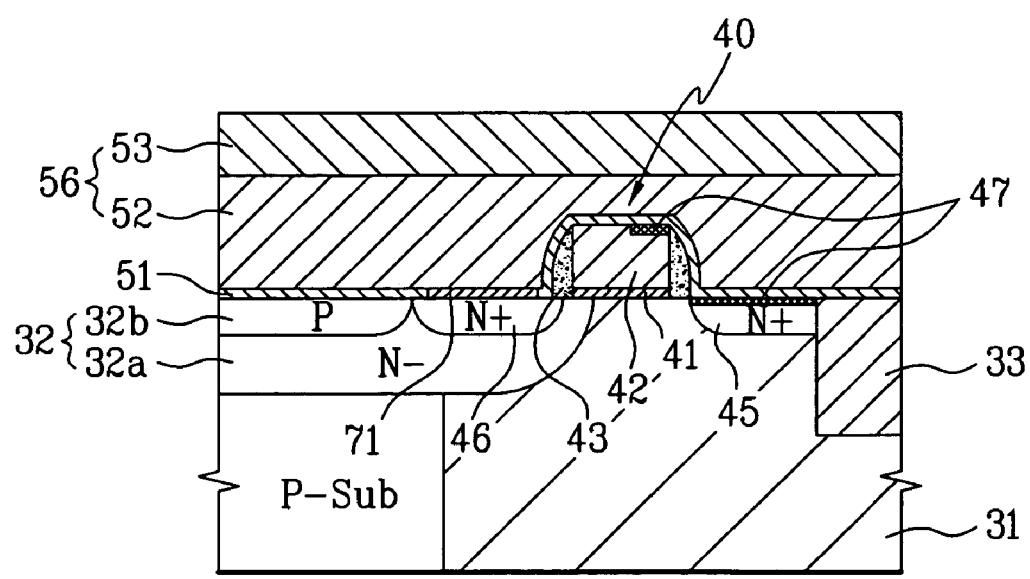

By performing a deposition process such as a high-pressure CVD process, as shown in FIG. 3J, the first insulating interlayer, for example, the BPSG layer 52 is formed above the semiconductor substrate 31, and then is planarized by a CMP process.

After that, a CVD process is additionally performed thereon, so that the second insulating interlayer, for example, the TEOS layer 53 is formed on the first insulating interlayer, and then is planarized by a CMP process, thereby completing the insulating interlayer 56. At this time, the insulating interlayer may have the various structures on the circumstances.

After completing the insulating interlayer 56, a photoresist layer is formed on the insulating interlayer 56 by a deposition process, and then is selectively etched, thereby forming a photoresist pattern (not shown) corresponding to the area for the open hole.

Figure 3K:
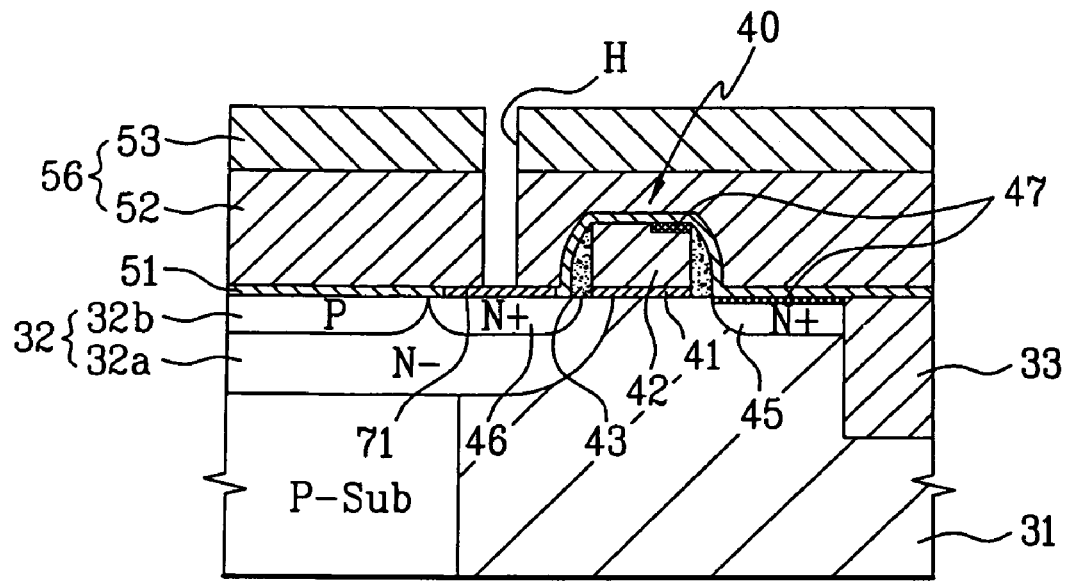

Subsequently, an exposure and development process is performed on the photoresist pattern, thereby exposing the impurity implantation layer 71 of the semiconductor substrate 31, as shown in FIG. 3K. As a result, it is possible to form the open hole H for the electric connection between the source diffusion layer 46 and the metal line 55. Then, the photoresist pattern is removed.

After completing the open hole H, a barrier metal layer (not shown), for example, a Ti/TiN layer having a constant thickness is formed on the insulating interlayer including the open hole H by a deposition process such as sputtering.

Figure 3L:
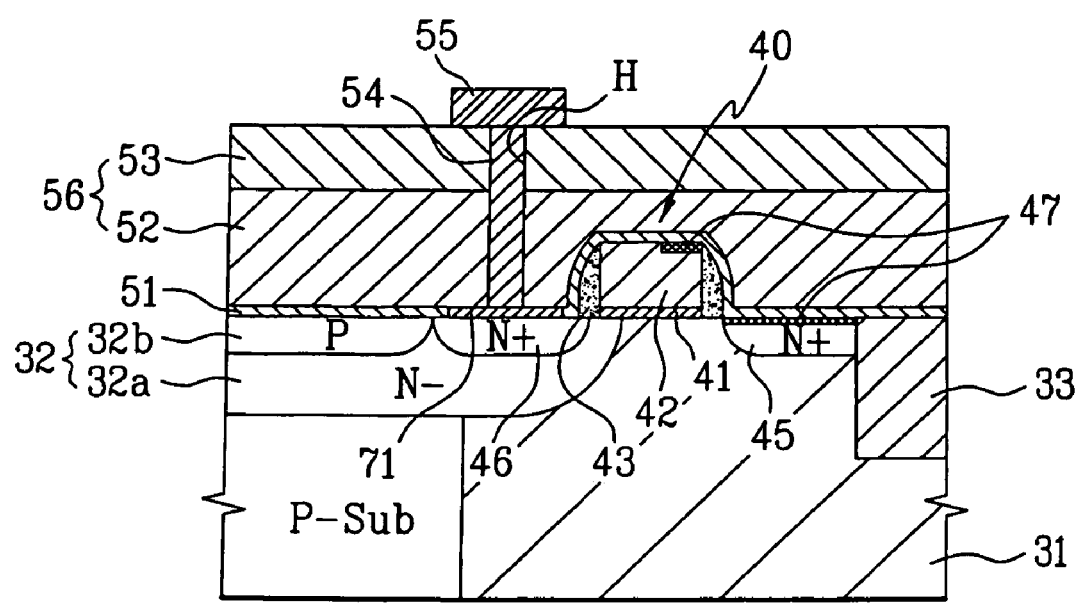

Then, a tungsten layer is thickly formed on the insulating interlayer 56 including the open hole H having the barrier metal layer by a deposition process. Then, the tungsten layer including the barrier metal layer is partially removed by a CMP process, as shown in FIG. 3L, thereby forming the contact plug 54 of selectively filling the inside of the open hole H, and forming the electric connection between the source diffusion layer 46 of the semiconductor substrate 31 and the metal layer 55.

After that, the metal layer 55 is formed above the open hole H by sequentially performing deposition and patterning process, whereby the metal layer 55 is electrically connected with the source diffusion layer 46 of the semiconductor substrate 31 by the contact plug 54.

Thereafter, the following steps such as the metal line formation process, the insulating interlayer formation process, the color pattern formation process, the planarization layer formation process, and the micro-lens array formation process are performed in sequence, thereby completing the image sensor.

As mentioned above, the image sensor and the method for fabricating the same according to the present invention have the following advantages.

In the image sensor according to the present invention, the impurity implantation layer having the predetermined thickness is formed on the source diffusion layer, thereby controlling the substantial contact point between the contact plug and the source diffusion layer upward from the surface of the semiconductor substrate. Accordingly, it is possible to minimize the length of the open hole, which is the main channel of the contact plug, so that the open hole has the sufficiently large size, thereby inducing the improvement of the contact quality between the contact plug and the source diffusion layer.

Also, in the CMOS image sensor according to the present invention, in state the impurity implantation layer having the impurity selectively implanted is formed on the source diffusion layer, the impurity implantation layer is electrically connected with the source diffusion layer. Accordingly, without the additional process such as highly-impurity implantation and formation of salicide layer, it is possible for the source diffusion layer to increase the impurity concentration of impurity therein. Eventually, in case of realizing the image sensor according to the present invention, it is possible to the greatest contact quality between the contact plug and the source diffusion layer.

Furthermore, in case of realizing the greatest contact quality between the contact plug and the source diffusion layer with the additional formation of the impurity implantation layer, for example, the source diffusion layer normally performs the function of converting the optical charges generated by the photodiode to voltage constituents (elements). Accordingly, the completed image sensor according to the present invention realizes the great image quality.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating an image sensor comprising:
   forming a photodiode and a transistor having an impurity diffusion layer being electrically connected with the photodiode, in an active area of a semiconductor substrate;
   forming an impurity implantation layer on the substrate including a portion of the impurity diffusion layer;
   selectively implanting impurities only into a portion of the impurity implantation layer covering the portion of the impurity diffusion layer;
   forming an insulating interlayer above the semiconductor substrate, the insulating interlayer for covering the photodiode, the transistor, and the impurity implantation layer;
   selectively opening the insulating interlayer to expose the impurity implantation layer; and
   forming a contact plug for electrically connecting the impurity implantation layer of the opened area with a metal layer provided above the insulation interlayer.

2. The method of claim 1, wherein the impurity implantation layer is formed by epitaxial growth.

* * * * *